United States Patent [19]
Ueda et al.

[11] Patent Number: 6,037,698
[45] Date of Patent: *Mar. 14, 2000

[54] ACOUSTIC SURFACE WAVE DEVICE

[75] Inventors: Masanori Ueda; Yoshiro Fujiwara; Takumi Kooriike, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/615,144

[22] Filed: Mar. 14, 1996

[30] Foreign Application Priority Data

Oct. 20, 1995 [JP] Japan .................................. 7-273141

[51] Int. Cl.⁷ .................................................. H03H 9/10
[52] U.S. Cl. ...................................... 310/313 R; 310/348
[58] Field of Search ............................... 310/313 R, 344, 310/348

[56] References Cited

U.S. PATENT DOCUMENTS

| | | | |
|---|---|---|---|
| 5,162,822 | 11/1992 | Wakamori | 310/313 R |
| 5,281,883 | 1/1994 | Ikata et al. | 310/313 R |
| 5,303,457 | 4/1994 | Falkner et al. | 29/25.35 |
| 5,357,662 | 10/1994 | Takagi et al. | 310/340 |
| 5,410,789 | 5/1995 | Noto et al. | 310/340 |
| 5,504,980 | 4/1996 | Yoshinaga et al. | 310/340 |

FOREIGN PATENT DOCUMENTS

| | | | |
|---|---|---|---|
| 60-180317 | 9/1985 | Japan | H03H 9/25 |
| 0017715 | 5/1987 | Japan | 310/344 |
| 63-131712 | 6/1988 | Japan | H03H 9/25 |
| 0247010 | 11/1991 | Japan | 310/344 |
| 15275965 | 10/1993 | Japan | 310/313 R |
| 16140870 | 5/1994 | Japan | 310/313 R |

*Primary Examiner*—Thomas M. Dougherty
*Attorney, Agent, or Firm*—Nikaido, Marmelstein, Murray & Oram LLP

[57] ABSTRACT

This invention relates to an acoustic surface wave device suitably used in a high-frequency circuit, in which high attenuation characteristics are provided.

The present invention includes an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening located above the ceramic substrate, each of the input terminal and the output terminal having a ground terminal, and a metallic cap sealing the opening of the ceramic package. The metallic cap is electrically connected to one of the ground terminal of the input terminal and the ground terminal of the output terminal.

14 Claims, 18 Drawing Sheets

ACOUSTIC SURFACE WAVE DEVICE

BACKGROUND OF THE INVENTION

1. Field of the Invention

The present invention generally relates to an acoustic surface wave device, and more particularly to an acoustic surface wave device suitably used in a high-frequency circuit.

2. Description of the Prior Art

With development of a small, light weight car telephone or portable telephone, filters using an acoustic surface wave have been developed to be incorporated in the car telephone or the portable telephone. Since an electrical circuit used in the car telephone or the portable telephone is an high-frequency circuit, the acoustic surface wave device is required to be suitable for the high-frequency wave.

FIGS. 1 and 2 show a conventional acoustic surface wave device 100. The acoustic surface wave device 100 is provided in the high-frequency circuit provided in, for example, the car telephone or the portable telephone, as an filter. FIG. 1 is an exploded perspective view, FIG. 2A is a perspective view and FIG. 2B is a perspective bottom view.

The acoustic surface wave device 100 includes a package 102, an acoustic surface wave element 103 and a metallic cap 104. The package 102 includes first, second and third ceramic substrates 105, 106, 107 provided in a stacked formation. In the package 102, an input terminal 108 and an output terminal 109, which are dotted in the drawing, are provided.

The input terminal 108 has a pair of input ground terminals 111, 112 and an input signal terminal 110 provided between the input ground terminals 111, 112. The output terminal 109 has a pair of output ground terminals 114, 115 and an output signal terminal 113 provided between the output ground terminals 114, 115.

The first ceramic substrate 105 is provided at the bottom of the package 102. On the first ceramic substrate 105, a die-attach portion 116 (shown as a dotted portion) is provided. The acoustic surface wave element 103 is mounted on the die-attach portion 116. The die-attach portion 116 has input ground connecting portions 118, 119, which are electrically connected to the input ground terminals 111, 112. Also, the die-attach portion 116 has output ground connecting portions 120, 121, which are electrically connected to the output ground terminals 114, 115. The input ground connecting portions 118, 119 and the output ground connecting portions 120, 121 are formed integrally with the die-attach portion 116.

The input signal terminal 110, the input ground terminals 111, 112, the output signal terminal 113 and the output ground terminals 114, 115 are exposed from the bottom face of the substrate body 105a to form foot patterns 110a–115a functioning as outer connecting terminals.

The second ceramic substrate 106 is provided in the middle of the package 102. The second ceramic substrate 106 includes a substrate body 106a and a plurality of pads 127–132 of electrical conductive metal layers formed on the substrate body 106a. The pads 127–132 are connected to the terminals 110–115 facing the pads 127–132. The pads 127–132 are electrically connected to the acoustic surface wave element 103 through wires (not shown). In a central portion of the substrate body 106a, an opening 133 housing the acoustic surface wave element 103 is formed. At four corners of the substrate body 106a of the second substrate 106, notches 134a–134d are formed.

The third ceramic substrate 107 is provided at the top of the package 102. In a central portion of the third ceramic substrate 107, an opening 136 is formed, which is larger than the opening 133 formed on the second ceramic substrate 106. On the whole surface of the third ceramic substrate 107, an upper wiring layer 137 (dotted portion) is formed to be electrically connected to the metallic cap 104. A substrate body 107a has four notches 138a–138d provided at each corner thereof, in which cap connecting wires 139a–139d (dotted portion) are provided. The cap connecting wires 139a–139d are electrically connected to the upper wiring layer 37.

The first through third ceramic substrates 105, 106, 107 are joined to form the package 102 shown in FIGS. 2A and 2B. After the package 102 is formed, the input signal terminal 110 and the input ground terminals 111, 112, the output signal terminal 113, the output ground terminals 114, 115 are electrically connected to form the input terminal 108 and the output terminal 109. Also, the cap connecting portions 140a–140d formed at each corner of the second ceramic substrate 106 are electrically connected to the cap connecting wires 139a–139d formed in the notches 138a–138d of the third ceramic substrate 107.

The acoustic surface wave element 103 is mounted in the die-attach portion 116 formed on the first ceramic substrate 105. An electrode provided on the acoustic surface wave element 103 is connected to the pads 127–132 provided on the second ceramic substrate 106 through wires. The acoustic surface wave element 103 is electrically connected to the input terminal 108 and the output terminal 109.

The metallic cap 104 is joined to the upper wiring layer 137 covering the opening 136 formed in the third ceramic substrate 107. The metallic cap 104 can be joined to the upper wiring layer 137 through a solder using a gold (Au)-tin (Sn) alloy or a tin (Sn)-lead (Pb) alloy. Thus, the metallic cap 104 is electrically connected to the input or output ground terminals 111, 112, 114, 115.

That is, the metallic cap 104 is electrically connected to each of the input or output ground terminals 111, 112, 114, 115 through the upper wiring layer 137, the cap connecting wires 139a–139d, the cap connecting portions 140a–140d, the ground pads 128, 129, 131, 132. Thus, the metallic cap 104 has a ground electric potential and functions as shielding characteristics to the acoustic surface wave element 103.

FIG. 3 is a circuit diagram of the package 102 of the conventional acoustic surface wave device 100. In the acoustic surface wave device 100 using the high-frequency wave, the signal terminals 110, 113 are electrically connected to the ground terminals 111, 112, 114, 115 in the package 102. Also, since the ground terminals 111, 112, 114, 115 have an impedance, the ground terminals 111, 112, 114, 115 cannot have an ideal ground electric potential. Also, the metallic cap 104 having the shielding effect and the die-attach portion cannot have an ideal ground electric potential.

Z1–Z14 in FIG. 3 represent an impedance of various portions in the package 102. Each represents the impedance as follows.

Z1: Impedance of the input signal terminal 110

Z2: Impedance due to a capacitance between the input signal pad 127 and the ground pads 128, 129

Z3: Impedance of the input ground terminals 111, 112

Z4: Impedance due to a capacitance between the input signal foot pattern 110a and the ground foot patterns 111a, 112a Z5: Impedance of the output signal terminal 113

Z6: Impedance due to a capacitance between the output signal foot pattern 113a and the ground foot patterns 114a, 115a Z7: Impedance of the output ground terminals 114, 115

Z8: Impedance due to a capacitance between the output signal pad 130 and the ground pads 131, 132

Z9: Total impedance of the input cap connecting portions 139a, 139b and the upper wiring layer 137

Z10: Impedance of the metallic cap 104

Z11: Total impedance of the output cap connecting portions 139c, 139d and the upper wiring layer 137

Z12: Impedance of the input ground connecting portions 118, 119

Z13: Impedance of the die-attach portion 116

Z14: Impedance of the output ground connecting portions 120, 121

In the conventional acoustic surface wave device 100, the input ground terminals 111, 112 are electrically connected to the output ground terminals 114, 115 through Z9–Z14. That is, the input ground terminals 111, 112 are electrically connected to the output ground terminals 114, 115 through the metallic cap 104 and the die-attach portion 116.

In the acoustic surface wave device 100 in which the input ground terminals 111, 112 are electrically connected to the output ground terminals 114, 115, the attenuation characteristics thereof are deteriorated by the package 102, especially when a high-frequency wave is handled.

SUMMARY OF THE INVENTION

Accordingly, it is a general object of the present invention to provide a novel and useful acoustic surface wave device having a package structure by which high attenuation characteristics are provided.

The above object of the present invention is achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the metallic cap is electrically connected to one of the ground terminal of the input terminal and the ground terminal of the output terminal.

In the above invention, the input terminal and the output terminal may include a pad connected to the acoustic surface wave element and a foot pattern portion functioning as an outer output terminal, and the metallic cap may be electrically connected to one of the ground terminal of the input terminal and the ground terminal of the output terminal.

In the above invention, the die-attach portion may be electrically connected to one of the ground terminal of the input terminal and the ground terminal of the output terminal, and the metallic cap may be electrically connected to one of the input terminal and the output terminal to which the ground terminal is connected in the die-attach portion.

According to the invention, the electrical connection between the input terminal and the output terminal through the metallic cap may be blocked. Thus, attenuation characteristics of the acoustic surface wave element are prevented from being influenced and deteriorated by the package.

The above object of the present invention is also achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the die-attach portion is electrically connected to one of the ground terminal of the input terminal and the ground terminal of the output terminal. According to the invention, the electrical connection between the input terminal and the output terminal through the die-attach portion may be blocked. Thus, attenuation characteristics of the acoustic surface wave element are prevented from being influenced and deteriorated by the package.

The above object of the present invention is also achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the metallic cap is electrically connected to one of the ground terminal of the input terminal and the ground terminal of the output terminal, and the die-attach portion is electrically connected to one of the ground terminal of the input terminal and the ground terminal of the output terminal. According to the invention, the electrical connection between the input terminal and the output terminal through the metallic cap may be blocked. Further, the electrical connection between the input terminal and the output terminal through the die-attach portion may be blocked. Thus, attenuation characteristics of the acoustic surface wave element are prevented from being influenced and deteriorated by the package.

The above object of the present invention is also achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the metallic cap is electrically connected to one of the ground terminal of the input terminal and the ground terminal of the output terminal with a high impedance and the metallic cap is electrically connected to the other of the ground terminal of the input terminal and the ground terminal of the output terminal with a low impedance. According to the invention, the electrical connection between the input terminal and the output terminal through the metallic cap may be weakened. Thus, attenuation characteristics of the acoustic surface wave element are prevented from being influenced and deteriorated by the package.

The above object of the present invention is also achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the die attach portion is electrically connected to one of the ground terminal of the input terminal and the ground terminal of the output terminal with a high impedance and the die-attach portion is electrically connected to the other of the ground terminal of the input terminal and the ground terminal of the output terminal with a low impedance. According to the invention, the electrical connection between the input terminal and the output terminal through the die-attach portion may be weakened. Thus, attenuation characteristics of the acoustic surface wave element are prevented from being influenced and deteriorated by the package.

The above object of the present invention is also achieved by an acoustic surface wave device including an acoustic surface wave element, a ceramic package having a ceramic substrate of a multi-layer structure, the ceramic substrate having a die-attach portion on which the acoustic surface wave element is mounted, the ceramic package having an input terminal and an output terminal connected to the acoustic surface wave element, the ceramic package having an opening, each of the input terminal and the output terminal having a ground terminal, and a metallic cap sealing the opening of the ceramic package, wherein the metallic cap is electrically connected to one of the ground terminal of the input terminal and the ground terminal of the output terminal with a high impedance, the metallic cap is electrically connected to the other of the ground terminal of the input terminal and the ground terminal of the output terminal with a low impedance, the die attach portion is electrically connected to one of the ground terminal of the input terminal and the ground terminal of the output terminal with a high impedance and the die-attach portion is electrically connected to the other of the ground terminal of the input terminal and the ground terminal of the output terminal with a low impedance. According to the invention, the electrical connection between the input terminal and the output terminal through the metallic cap and the electrical connection between the input terminal and the output terminal through the die-attach portion may be weakened. Thus, attenuation characteristics of the acoustic surface wave element are prevented from being influenced and deteriorated by the package.

The present invention includes a device having a plurality of acoustic surface wave devices housed in the same ways as described above.

Other objects and further features of the present invention will be apparent from the following detailed description when read in conjunction with the accompanying drawings.

DESCRIPTION OF THE PREFERRED EMBODIMENTS

The preferred embodiments of the present invention will now be described in further detail with reference to the accompanying drawings.

Figure 4:
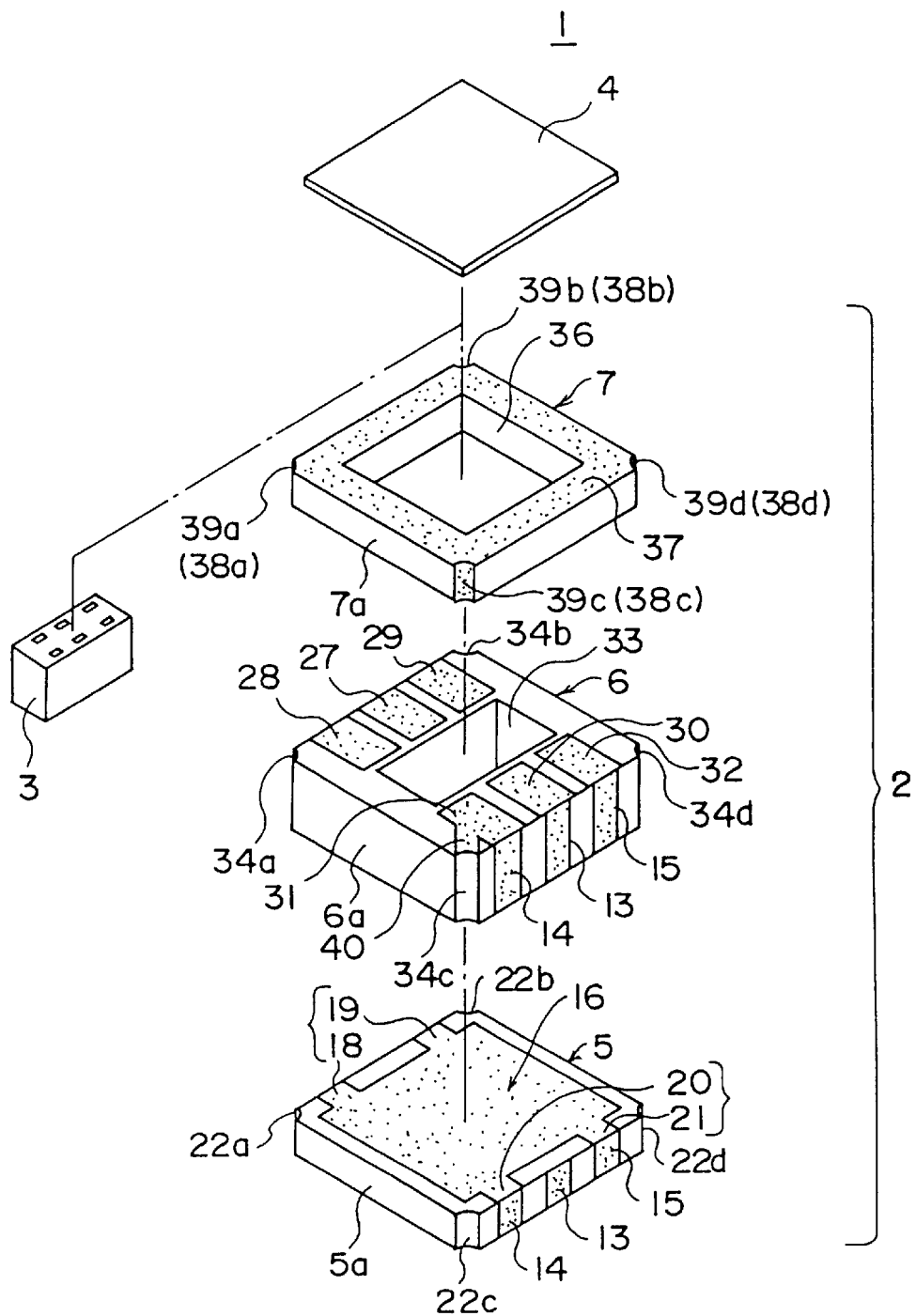
FIG. 4 is an exploded perspective view showing an acoustic surface wave device of a first embodiment of the present invention.
Figure 5:
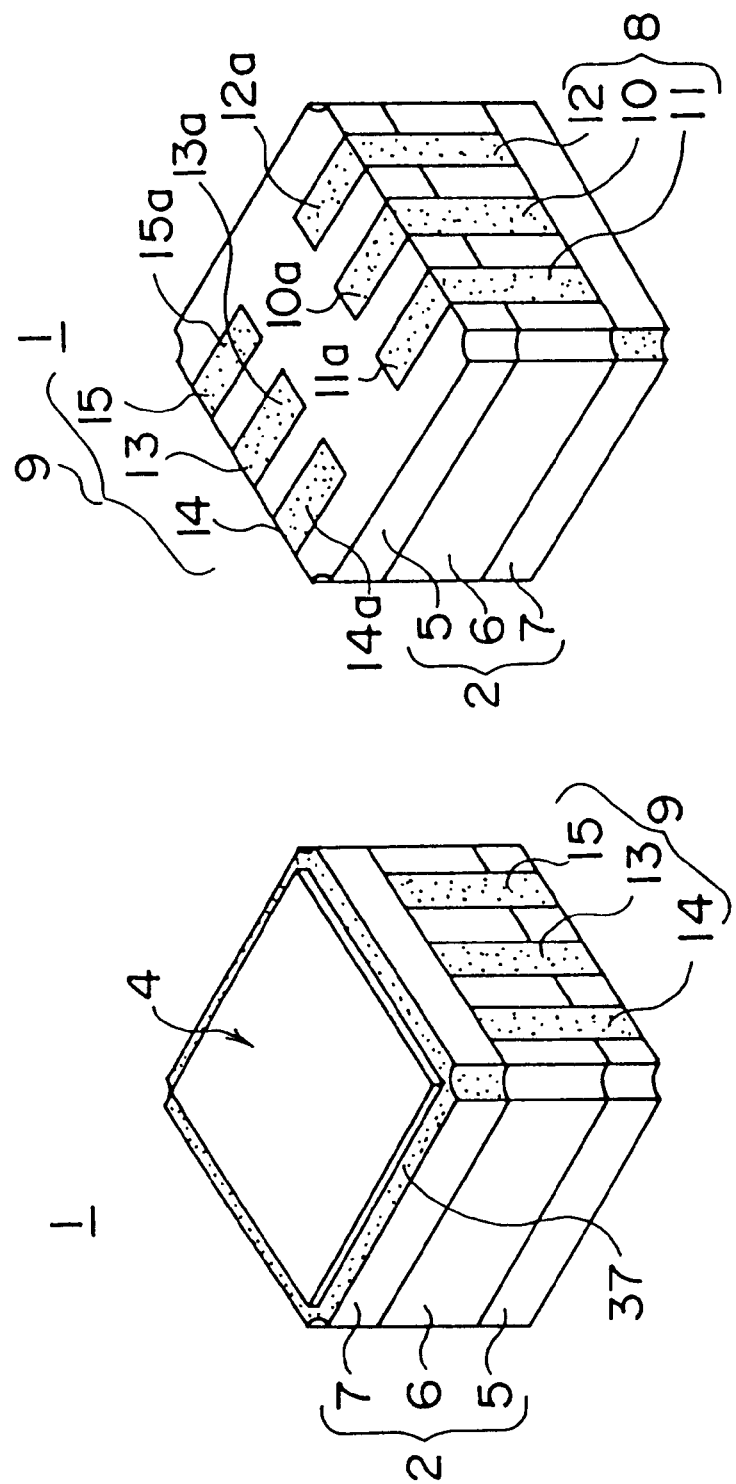
FIG. 5A is a perspective view showing the acoustic surface wave device of the first embodiment of the present invention.
FIG. 5B is a perspective bottom view showing the acoustic surface wave device of the first embodiment of the present invention.
Figure 6:
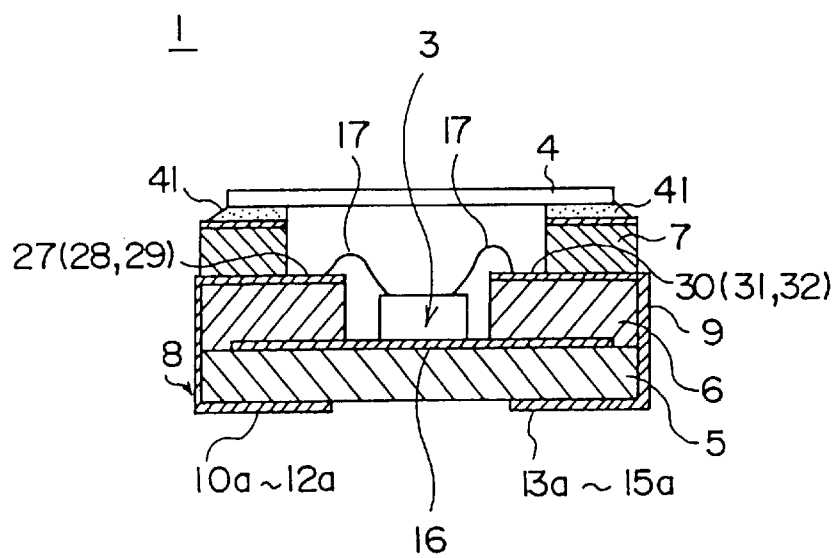
FIG. 6 is a cross-sectional view showing the acoustic surface wave device of the first embodiment of the present invention.

FIGS. 4, 5A, 5B, 6 show an acoustic surface wave device 1 of a first embodiment of the present invention. The acoustic surface wave device 1 is provided as a filter in a high-frequency circuit of, for example, a car telephone or a portable telephone. FIG. 4 is an exploded perspective view, FIG. 5A is a perspective view, FIG. 5B is a perspective bottom view, and FIG. 6 is a cross-sectional view.

The acoustic surface wave device 1 includes a package 2, an acoustic surface wave element 3 and a metallic cap 4. The package includes first, second and third ceramic substrates 5, 6, 7 provided in a stacked formation. In the package 2, an input terminal 8 and an output terminal 9, which are dotted in the drawing, are provided.

The input terminal 8 has a pair of input ground terminals 11, 12 and an input signal terminal 10 provided between the input ground terminals 11, 12. The output terminal 9 has a pair of output ground terminals 14, 15 and an output signal terminal 13 provided between the output ground terminals 14, 15.

Next, the ceramic substrates 5, 6, 7 of the package 2 will be described. The first ceramic substrate 5 is provided at the bottom of the package 2. In the first ceramic substrate 5, a die-attach portion 16 (dotted portion) is provided in a substrate body 5a of an electrical conductive layer, such as an Au/Ni/W layer. The acoustic surface wave element 3 is mounted on and is shielded by the die-attach portion 16.

In this embodiment, the die-attach portion 16 has input ground connecting portions 18, 19 formed in the input side of the substrate body 5a, which are electrically connected to the input ground terminals 11, 12. Also, the die-attach portion 16 has output ground connecting portions 20, 21 formed in the output side of the substrate body 5a, which are electrically connected to the output ground terminals 14, 15. The ground connecting portions 18–21 are formed integrally with the die-attach portion 16.

The input signal terminal 10, the input ground terminals 11, 12, the output signal terminal 13 and the output ground terminals 14, 15 are exposed from the bottom face of the substrate body 5a to form an input signal foot pattern 10a, input ground foot patterns 11a, 12a, an output signal foot pattern 13a and output ground foot patterns 14a, 15a as outer connecting terminals, as shown in FIG. 5B.

Figure 1:
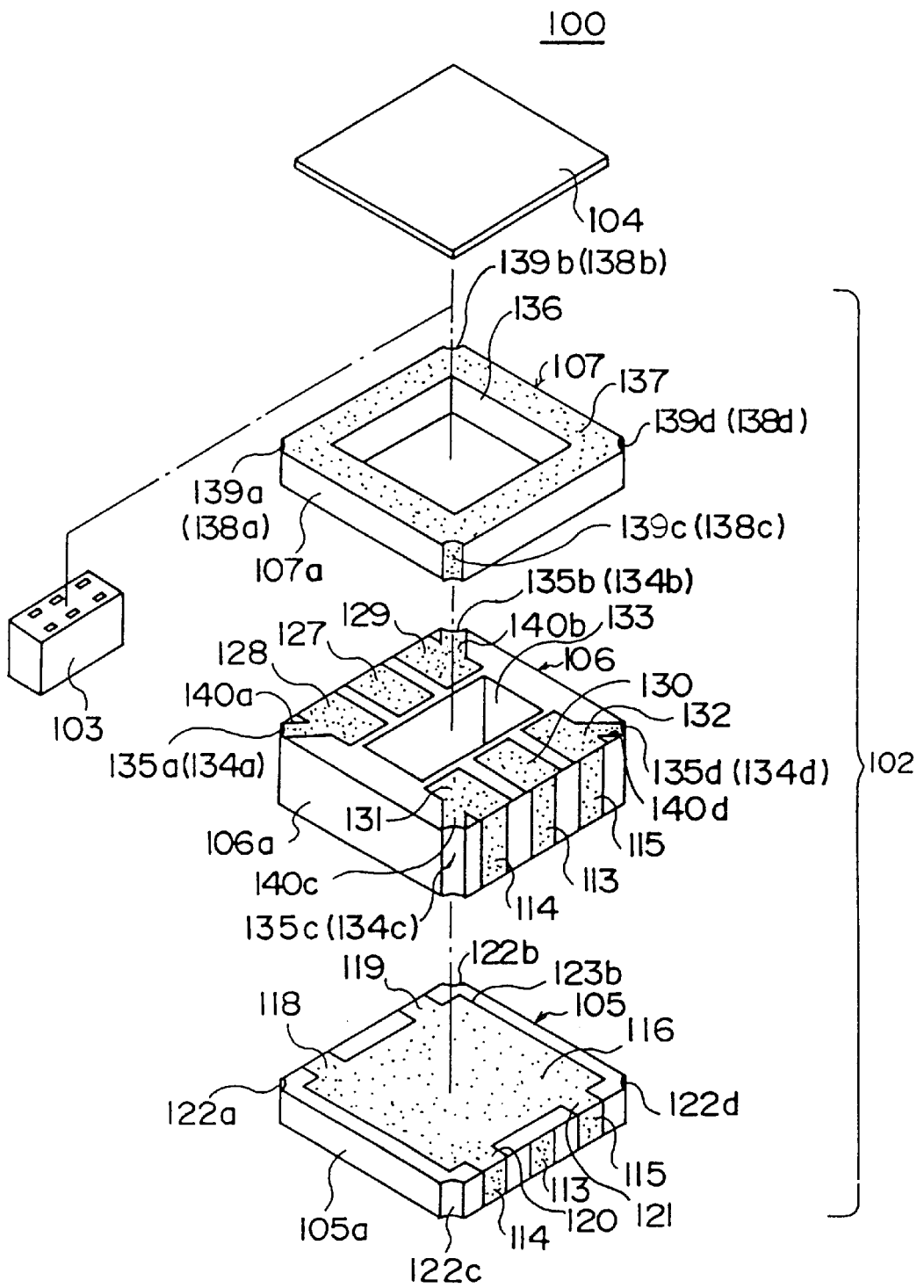
FIG. 1 is an exploded perspective view showing a conventional acoustic surface wave device.

The substrate body 5a has four notches 22a–22d formed at each corner. In the acoustic surface wave device 1, the cap connecting portions 123a–123d, which are provided in the conventional acoustic surface wave device 100 shown in FIG. 1, are not formed. Thus, the die-attach portion 16 is not led to the notches 22a–22d.

The second ceramic substrate 6 is provided in the middle of the package 2. The second ceramic substrate 6 includes a substrate body 6a and a plurality of pads 27–32 of electrical conductive metal layers formed on the substrate body 6a. A input signal pad 27 is connected to the input signal terminal 10, input ground pads 28, 29 are connected to the input ground terminals 11, 12, an output signal pad 30 is connected to the output signal terminal 13 and output ground pads 31, 32 are connected to the output ground terminals 14, 15.

Each of the pads 27–32 is electrically connected through the acoustic surface wave element 3 and wires 17, as shown in FIG. 6. In a central portion of the substrate body 6a, an opening 33 is formed in order to mount the acoustic surface wave element 3. At each corner of the substrate body 6a, notches 34a–34d are formed.

The acoustic surface wave device 1 is characterized in that a cap connecting pattern 40 is integrally provided in the output ground pad 31 and the cap connecting pattern 40 is led to the notch 34c. The cap connecting pattern 40 is provided only in the output ground pad 31.

The third ceramic substrate 7 is provided at the top of the package 2. In a central portion of the third ceramic substrate 7, an opening 36 are formed, which is larger than the opening formed on the second ceramic substrate 6. On a whole surface of the third ceramic substrate 7, an upper wiring layer 37 (dotted portion) are formed to be electrically connected to the metallic cap. The substrate body 7a has four notches 38a–38d provided at each corner thereof, in which cap connecting wires 39a–39d (dotted portion) are provided. The cap connecting wires 39a–39d are electrically connected to the upper wiring layer 37. The first through third ceramic substrates 5, 6, 7 are joined to form the package 2 shown in FIGS. 5A and 5B. After the package is formed, the input signal terminal 10 and the input ground terminals provided between the first and the second ceramic substrates 5, 6 are electrically connected to form the input terminal 108. Also, the outer signal terminal 13 and the output ground terminal 14, 15 are electrically connected to form the input terminal 108 and the output terminal 109.

Through the above process, the foot patterns 10a–15a formed on the first ceramic substrate 5 are electrically connected to the pads 27–31 formed in the second ceramic substrate 6 through the terminals. Also, the die-attach portion 16 is connected to the output or input ground terminals 11, 12, 14, 15 through the ground connecting portions 18–21.

At each corner of the third ceramic substrate 7, the cap connecting wires 39a–39d are formed, as described above. In the second ceramic substrate 6, the cap connecting pattern 40 connected to the output ground pad 31 is lead to the notch 34c. Thus, when the second ceramic substrate 6 and the third ceramic substrate 7 are stacked, only the output ground pad 31 is electrically connected to the upper wiring layer 3 formed on the third ceramic substrate through the cap connecting wire 39c.

The acoustic surface wave element 3 is mounted in the die-attach portion 16 formed on the first ceramic substrate 5. An electrode provided on the acoustic surface wave element 3 is connected to the pads 27–32 provided on the second ceramic substrate 6 through the wire 17. The acoustic surface wave element 3 is electrically connected to the input terminal 8 and the output terminal 9 in a manner described above.

The metallic cap 4 is joined to the upper wiring layer 37 covering the opening 36 formed in the third ceramic substrate 7. The metallic cap 4 can be joined to the upper wiring layer 37 through a solder 41 using a gold (Au)-tin (Sn) alloy or a tin (Sn)-lead (Pb) alloy, as shown in FIG. 6.

In the structure described above, the metallic cap 4 is electrically connected only to the outer ground terminal 14. That is, the metallic cap 4 is electrically connected to the outer ground terminal 14 through the upper wiring layer 37, the cap connecting wire 39c, the cap connecting pattern and the output ground pad 31. Thus, the metallic can 4 has a ground electric potential and functions as a shield to the acoustic surface wave element 3.

Figure 7:
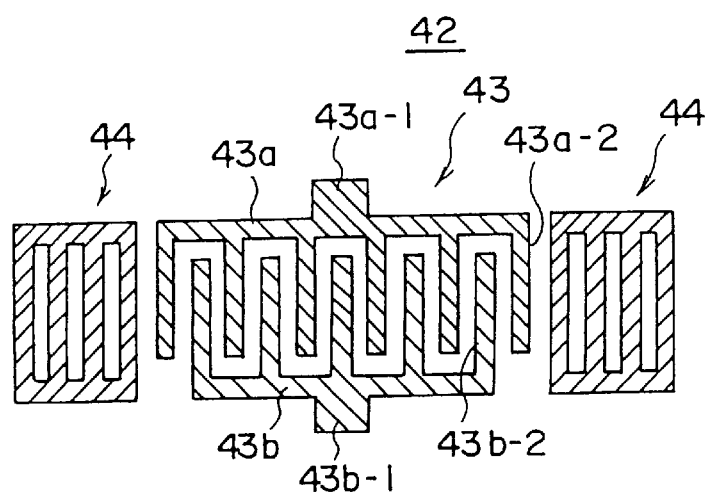
FIG. 7 is a schematic illustration showing an acoustic surface wave resonator of the first embodiment of the present invention.
Figure 8:
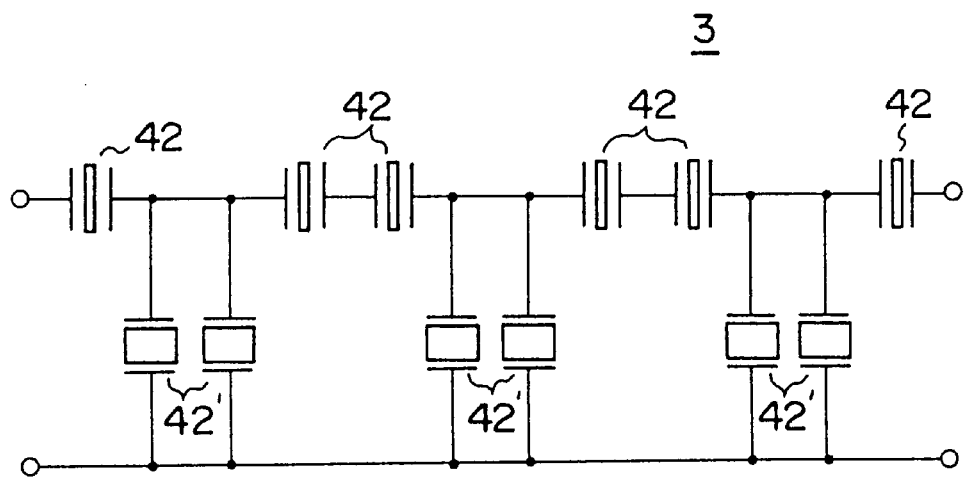
FIG. 8 is a circuit diagram showing the acoustic surface wave resonator of the first embodiment of the present invention.
Figure 19:
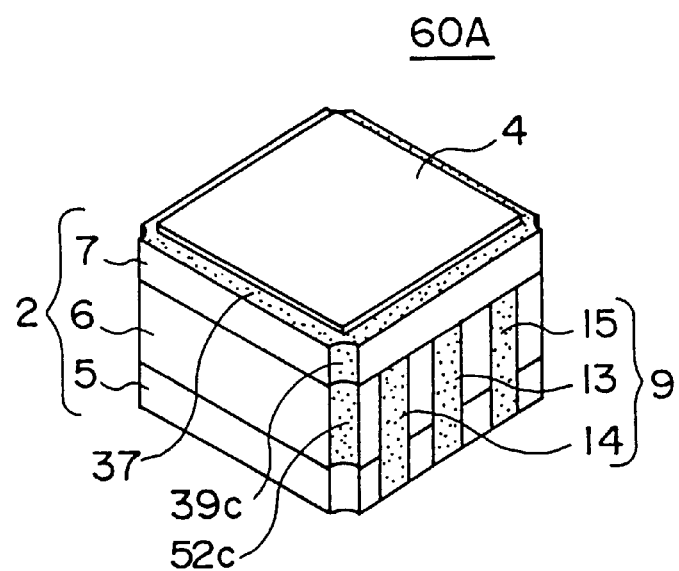
FIG. 19 is a perspective view showing the acoustic surface wave device of the first variation of the third embodiment of the present invention.

FIGS. 7 and 8 show the acoustic surface wave element 3 used in the present embodiment. FIG. 7 shows one of acoustic surface wave resonators 42 and 42' used in the acoustic surface wave element 3. As shown in FIG. 7, each of the acoustic surface wave resonators 42 and 42' includes a pair of reflectors 44 and a drive electrode 43 provided between the reflectors 44. The resonance frequency of each of the resonators 42 is nearly equal to the anti-resonance frequency of each of the resonators 42'.

The drive electrode 43 includes a first electrode 43a and a second electrode 43b. The first electrode 43a has an input electrode $43a_{-1}$ to input a signal. The second electrode $43b$ has an output electrode $43b_{-1}$ to output a signal. The resonance frequency of the resonators 42 depends on the electrode pitch.

The reflector has a stripe pattern parallel to the drive electrode 43. The reflector 44 is short-circuited in order to reflect the acoustic surface wave generated on the piezoelectric substrate. In the acoustic surface wave element 3, a plurality of the resonators 42 are provided in order to provided desired attenuation characteristics.

The acoustic surface wave device 1 functions as follows. In the acoustic surface wave device 1 of the present invention, the metallic cap 4 is electrically connected only to the output ground terminal 14. This structure is equivalent to the circuit shown in FIG. 3 in which the position Z9 is blocked. That is, an electrical connection between the input ground terminals 11, 12 and the output ground terminals 14, 15 is broken. Therefore, the attenuation characteristics of the acoustic surface wave element 3 are prevented from being influenced by the package 4 and being lowered.

Since the metallic cap 4 is maintained to be electrically connected to the output ground terminals 14, 15 in the above structure, the metallic cap 4 has a ground electric potential. Thus, the metallic cap 4 has a shield effect even in the structure described above, anti-noise characteristics can be improved.

Figure 2B:
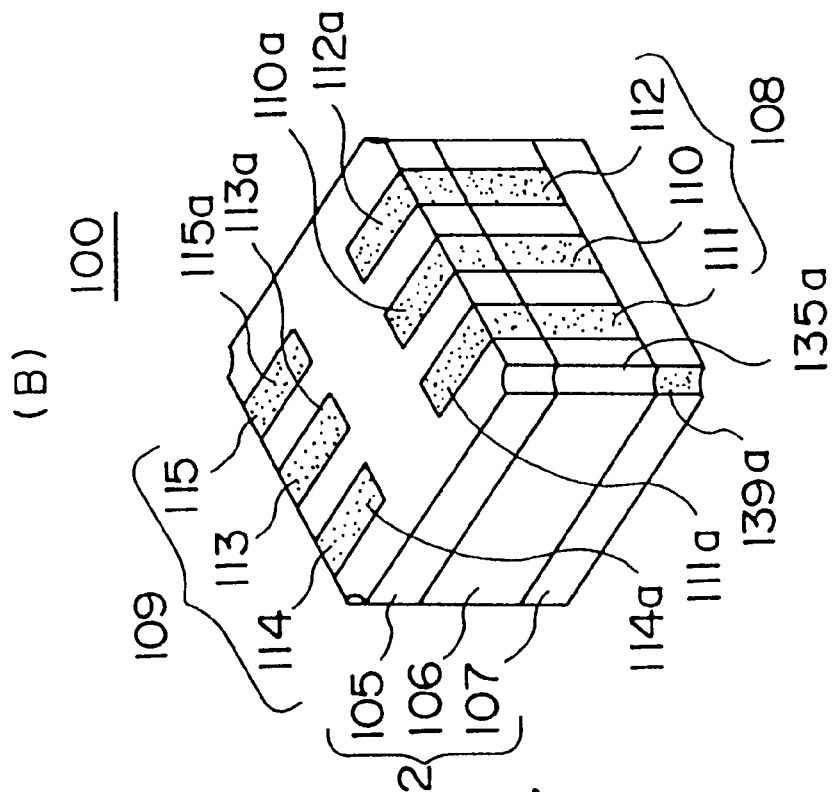
FIG. 2B is a perspective bottom view showing the conventional acoustic surface wave device.
Figure 2A:
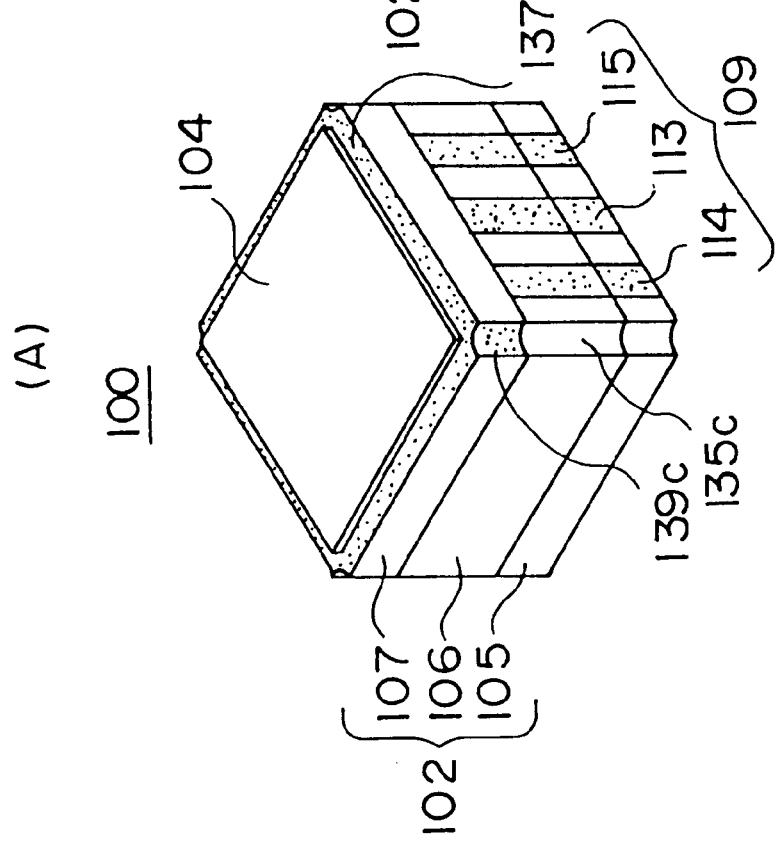
FIG. 2A is a perspective view showing the conventional acoustic surface wave device.
Figure 9:
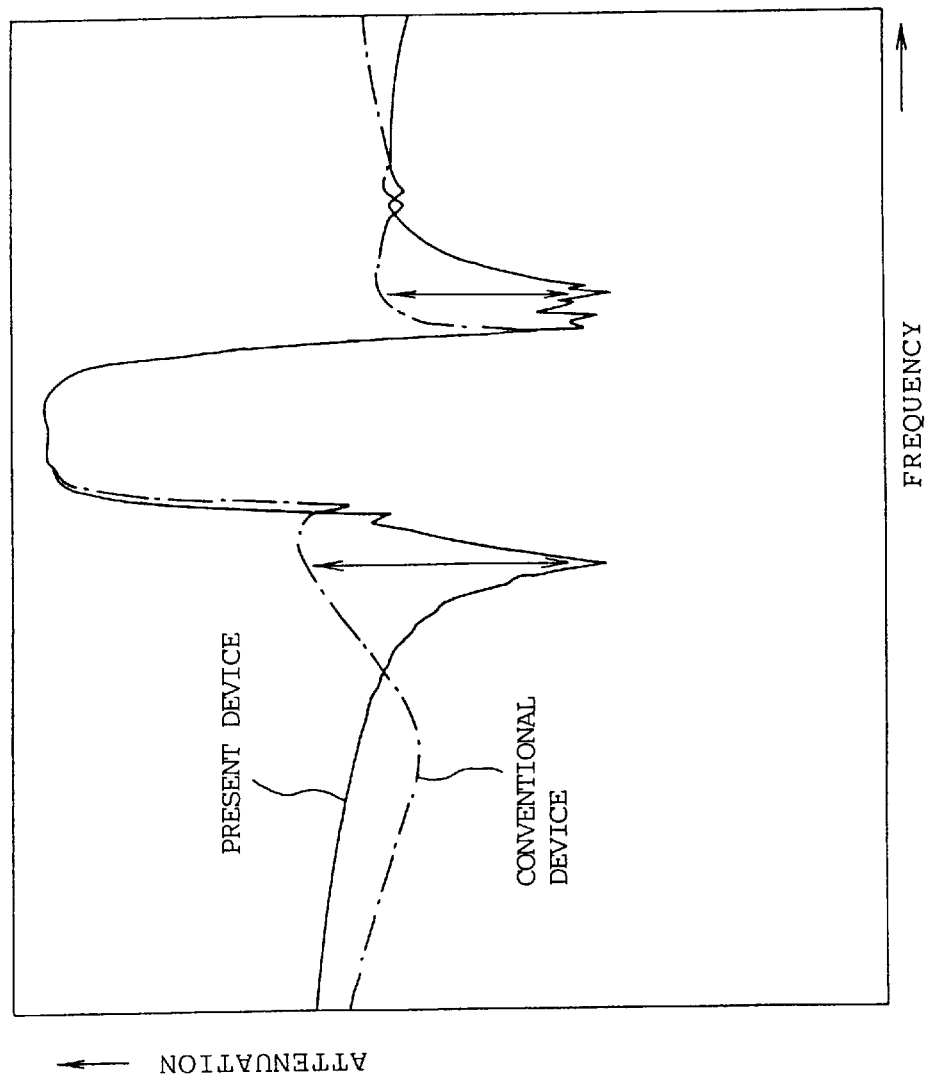
FIG. 9 is a graph showing attenuation characteristics of the acoustic surface wave device of the first embodiment of the present invention.

FIG. 9 is a graph showing attenuation characteristics of the acoustic surface wave device 1 of the present invention. In FIG. 9, the attenuation characteristics of the conventional acoustic surface wave device 100 shown in FIGS. 1 and 2 are also shown for a compression. As can be seen from FIG. 9, the attenuation characteristic of the acoustic surface wave device 1 is improved by 10–20 dB outside a band, compared with the conventional acoustic surface wave device 100. According to FIG. 9, the acoustic surface wave device 1 of this embodiment improve the attenuation characteristic, compared with the conventional acoustic surface wave device 100.

Figure 10:
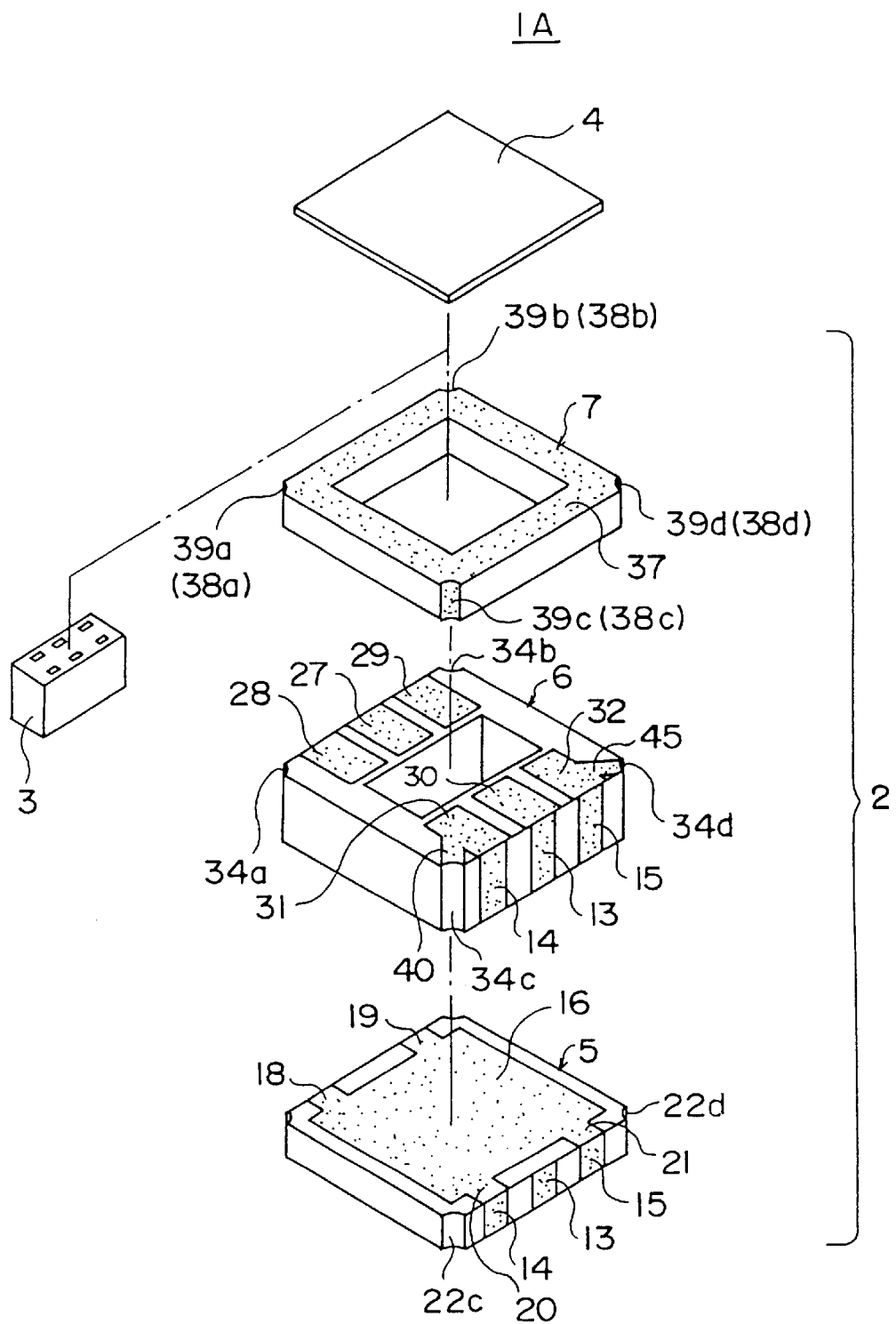
FIG. 10 is an exploded perspective view showing an acoustic surface wave device of a first variation of the first embodiment of the present invention.

FIG. 10 shows an acoustic surface wave device 1A of a first variation of the first embodiment. In the following description, the same features as those previously described will be denoted by the same reference numerals and the descriptions thereof will be omitted.

In the acoustic surface wave device 1 of the first embodiment described above, the cap connecting pattern 40 is provided only in one of the output ground pads 31. However, in the acoustic surface wave device 1A of the first variation, the cap connecting pattern 40 is provided in one of the output ground pads 31 and the a cap connecting pattern 45 is provided in the other output ground pads 32.

In the above acoustic surface wave device 1A, the metallic cap 4 is electrically connected to the output ground terminal 14 through the upper wiring layer 37, the cap connecting wire 39c, the cap connecting pattern 40 and the output ground pad 31. Also, the metallic cap 4 is electrically connected to the output ground terminal 15 through the upper wiring layer 37, the cap connecting wire 39d, the cap connecting pattern 45 and the output ground pad 15.

In the acoustic surface wave device 1A of this variation, the metallic cap 4 is connected to the output terminal 9 (the output ground terminals 14, 15). Thus, the attenuation characteristics are improved. Also, in this variation, since the metallic cap 4 is connected both the output ground terminals 14, 15 of a pair, shield characteristics to the acoustic surface wave element 3 may also be improved.

Figure 11:
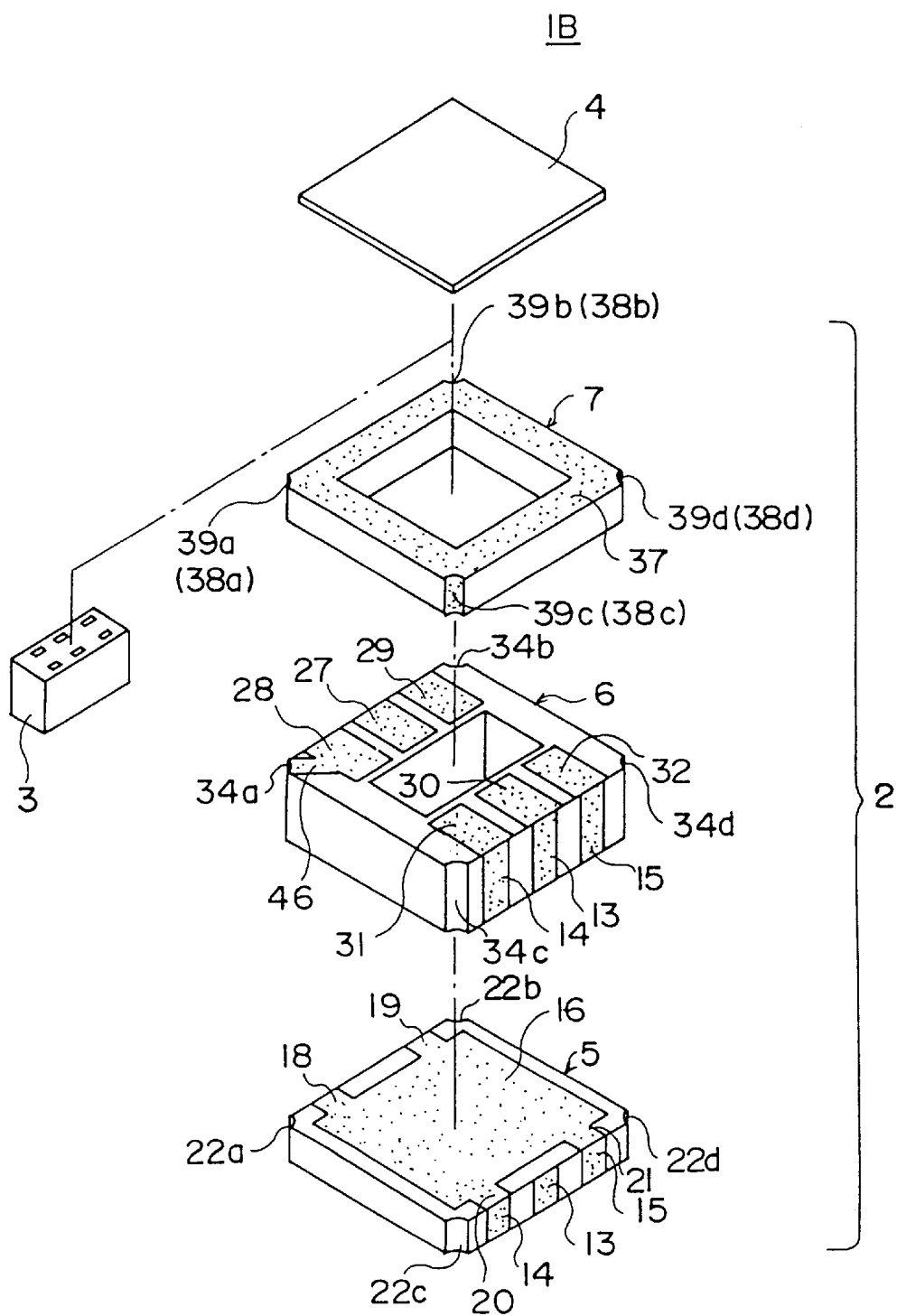
FIG. 11 is an exploded perspective view showing an acoustic surface wave device of a second variation of the first embodiment of the present invention.
Figure 12:
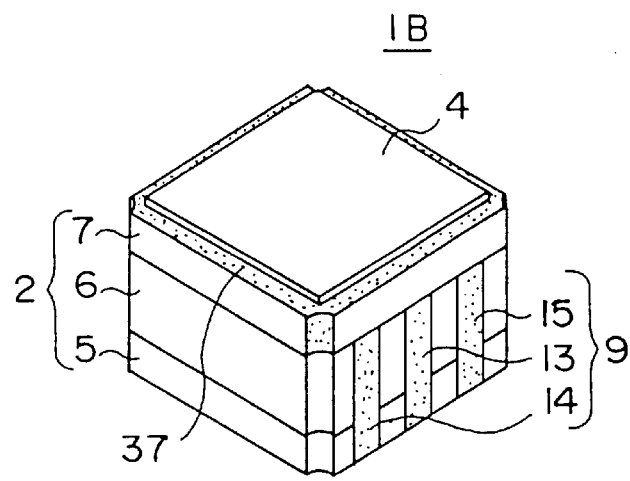
FIG. 12 is a perspective view showing the acoustic surface wave device of the second variation of the first embodiment of the present invention.

FIGS. 11 and 12 show an acoustic surface wave device of a second embodiment of the first embodiment of the present invention. In the acoustic surface wave device 1 of the first embodiment, the cap connecting pattern 40 is provided in the output ground pad 31. However, in an acoustic surface wave device 1B of this second variation, the cap connecting pattern 40 is provided in the input ground pad 28.

A position of the cap connecting pattern is not limited to an output side, as described above, as long as the cap connecting pattern 40 is connected to either the input terminal 8 or the output terminal. Accordingly, even when the cap connecting pattern 40 are formed in the output ground pad of the input terminal 8, the same benefit as that of the first embodiment can be provided. Also, the cap connecting pattern may be formed in both the input ground pads 28, 29, based on the same reason as described with reference to the first variation.

Figure 14:
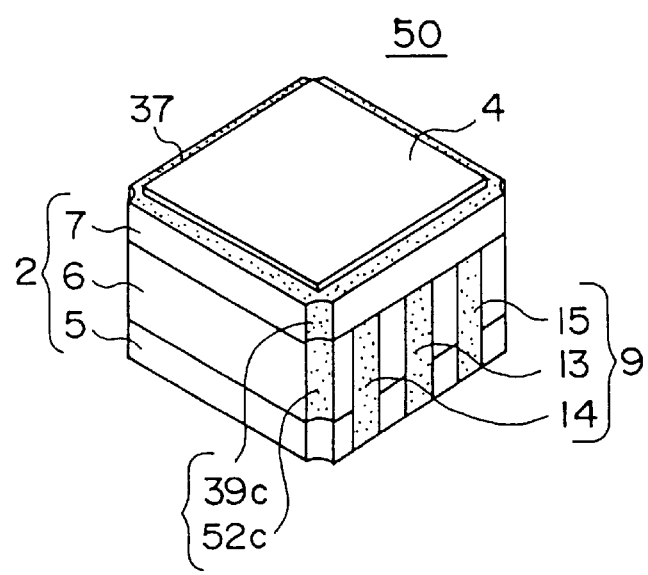
FIG. 14 is a perspective view showing the acoustic surface wave device of the second embodiment of the present invention.
Figure 13:
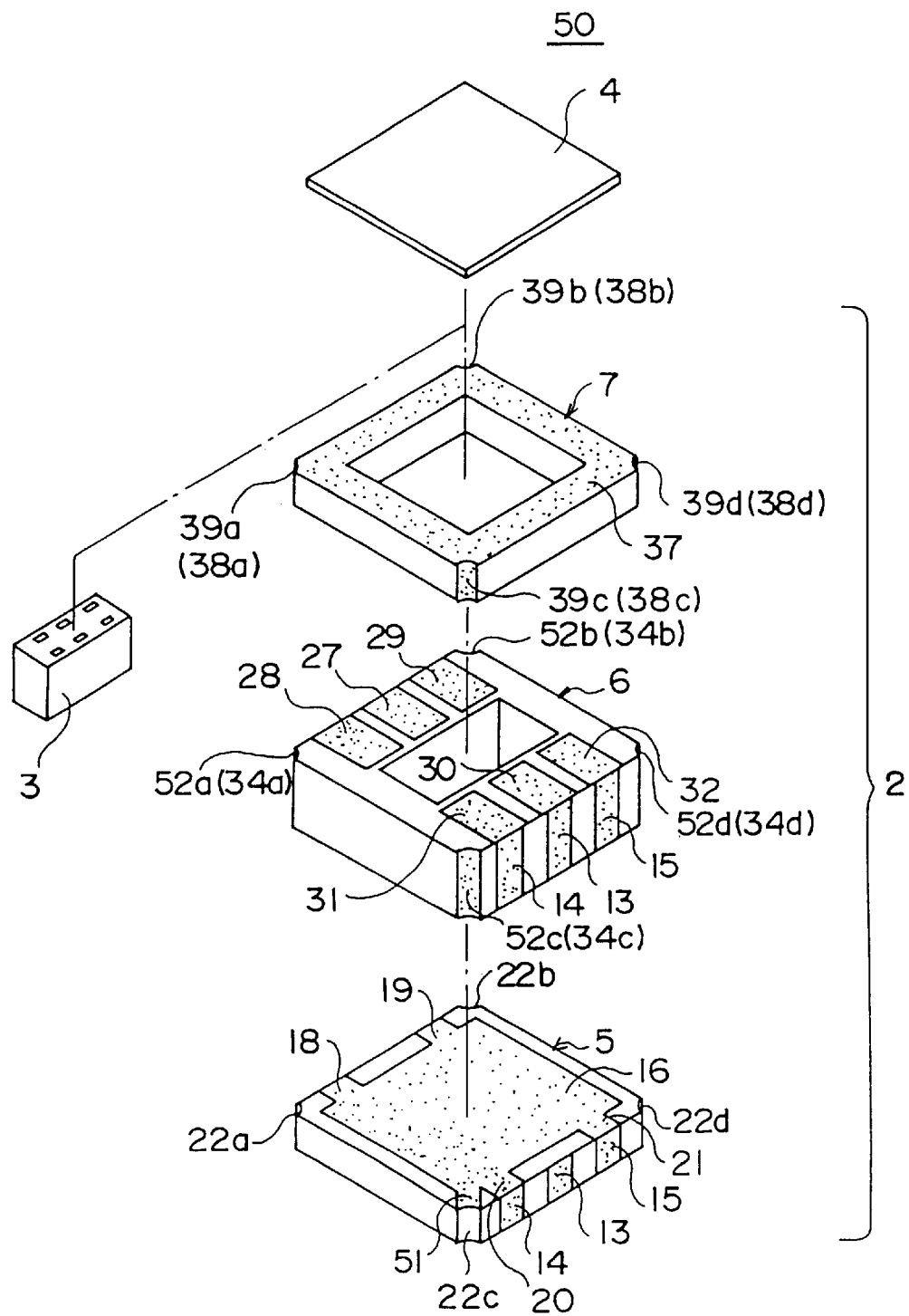
FIG. 13 is an exploded perspective view showing an acoustic surface wave device of a second embodiment of the present invention.

FIGS. 13 and 14 show an acoustic surface wave device 50 of a second embodiment of the present invention.

In the acoustic surface wave device 1 of the first embodiment, the cap connecting pattern 40 is provided in the output ground pad 31. However, in the acoustic surface wave device 50 of the second embodiment, a cap connecting pattern 51 is provided in the first ceramic substrate 5.

The cap connecting pattern 51 is formed integrally with the die-attach portion 16 and is led to the notch 22c. In the acoustic surface wave device 50 of this embodiment, cap connecting wirings 52a–52d are provided in the notches 34a–34c formed at four corners of the second ceramic substrate 6. In this embodiment, the cap connecting pattern is not formed in the second ceramic substrate 6, which is different from the acoustic surface wave devices 1, 1A, 1B of the above embodiments.

In this embodiment, the metallic cap 4 is electrically connected to the output ground terminal 14 through the upper wiring layer 37, the cap connecting wire 39c, the cap connecting wire 52c, the cap connecting pattern 51, the die-attach portion 16 and the output ground connecting portion 20. That is, the metallic cap 4 is connected only to the output ground terminal 14 and attenuation characteristics may be improved while maintaining shield characteristics.

In the above embodiment, the cap connecting pattern 51 is provided adjacent to the output ground terminal 20 connected to the output ground terminal 14. In addition to that, the cap connecting pattern may be led to the notch 22d adjacent to the output ground terminal portion 21 in order that the metallic cap 4 is connected to the output ground terminal 15.

Figure 15:
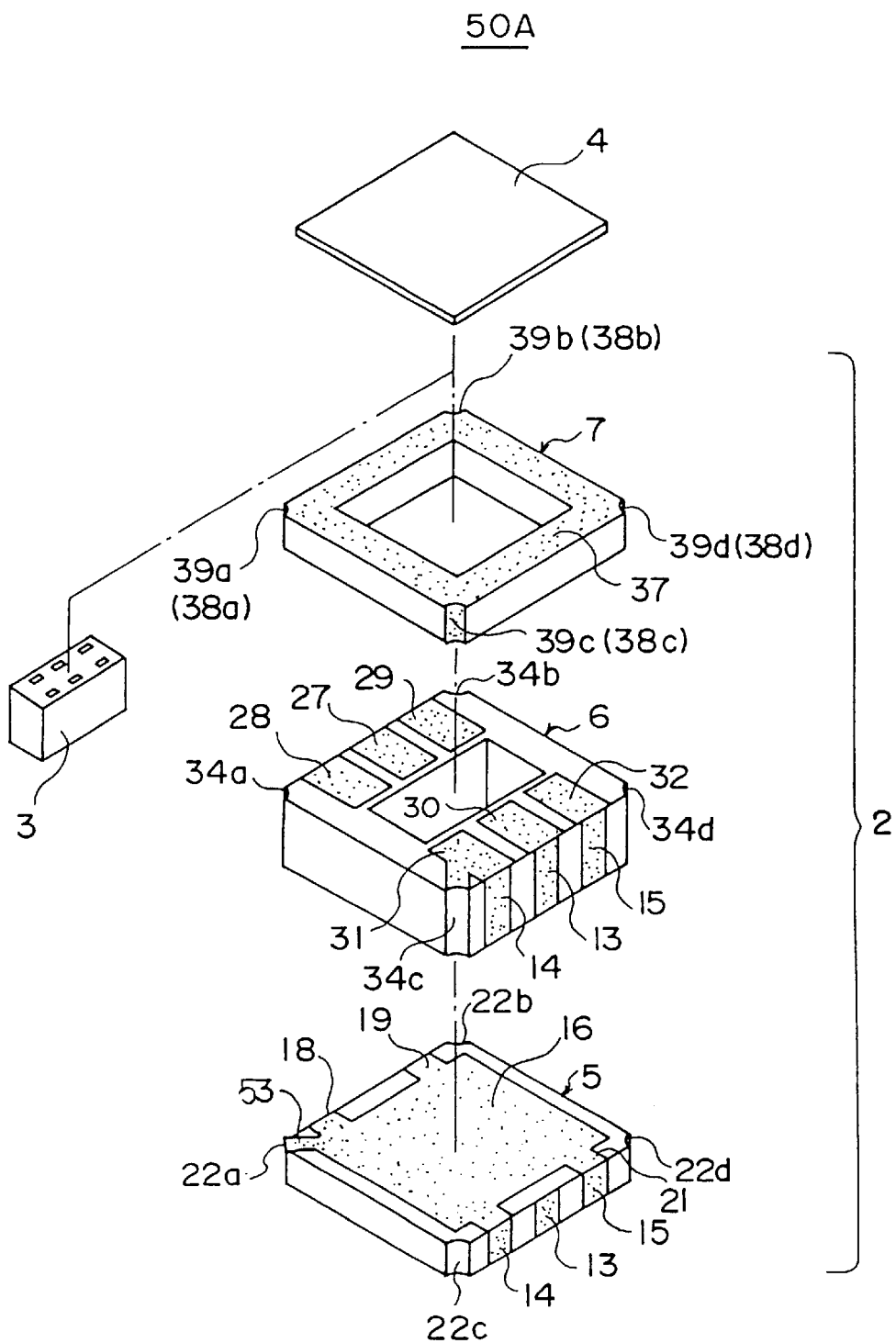
FIG. 15 is an exploded perspective view showing an acoustic surface wave device of a variation of the second embodiment of the present invention.

FIG. 15 shows an acoustic surface wave device 50A of a variation of the acoustic surface wave device 50. In the acoustic surface wave device 50 of the second embodiment, the cap connecting pattern 51 is provided in the output side of the die-attach portion 16 to be connected to the output ground terminal 14. However, in the acoustic surface wave device 50A of this variation, the cap connecting pattern 53 is provided in the input side of the die-attach portion 16.

Even in a structure in which the cap connecting pattern is formed in the first ceramic substrate 5, the position of the cap connecting pattern is not limited to the output side, as long as the cap connecting pattern is connected to either the input terminal or the output terminal 9.

By the structure in which the cap connecting pattern 53 is provided in the input side of the die-attach portion 16 to be electrically connected to the input ground pad 28 of the input terminal 8, attenuation characteristics are improved with maintaining shielding characteristics. For the same reason described above, the cap connecting pattern may be formed to be led to both notches 34a, 34b.

Figure 16:
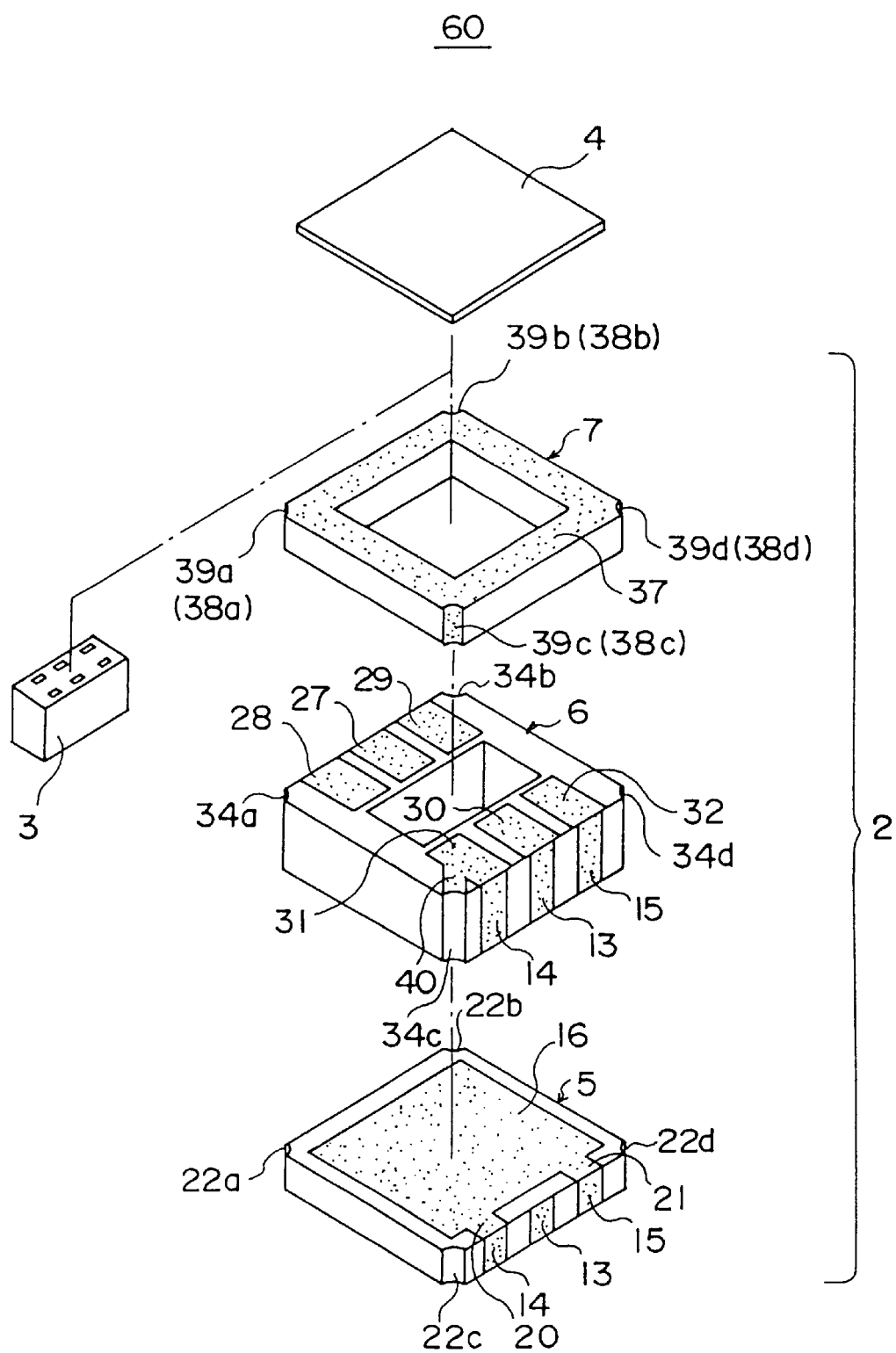
FIG. 16 is an exploded perspective view showing an acoustic surface wave device of a third embodiment of the present invention.

FIG. 16 shows an acoustic surface wave device 60 of a third embodiment of the present invention. In the acoustic surface wave devices 1, 1A, 1B, 50, 50A of the above embodiments, the die-attach portion 16 is electrically connected to both the input ground terminals 11, 12 and the output ground terminals 14, 15. When a high-frequency component is low, attenuation characteristics are not lowered by the die-attach portion 16. Thus, the acoustic surface wave devices 1, 1A, 1B, 50, 50A of the above embodiments improve the attenuation characteristics, compared with the conventional acoustic surface wave device 100.

However in a high-frequency circuit handling a very high frequency wave, influence of the die-attach portion 16 can not be neglected. Accordingly, in this embodiment, the die-attach portion 16 is electrically connected only to the output ground terminals 14, 15 of the output terminal 9.

The acoustic surface wave device 60 of this embodiment basically has the same structure as the acoustic surface wave device 1A shown in FIG. 10 except that the input ground connecting portions 18, 19 provided in the acoustic surface wave device 1A shown in FIG. 10 are not provided. In this embodiment, the metallic cap 4 is electrically connected only to the output ground terminal 14 and the die-attach portion 16 is electrically connected only to the output ground terminals 14, 15.

Figure 3:
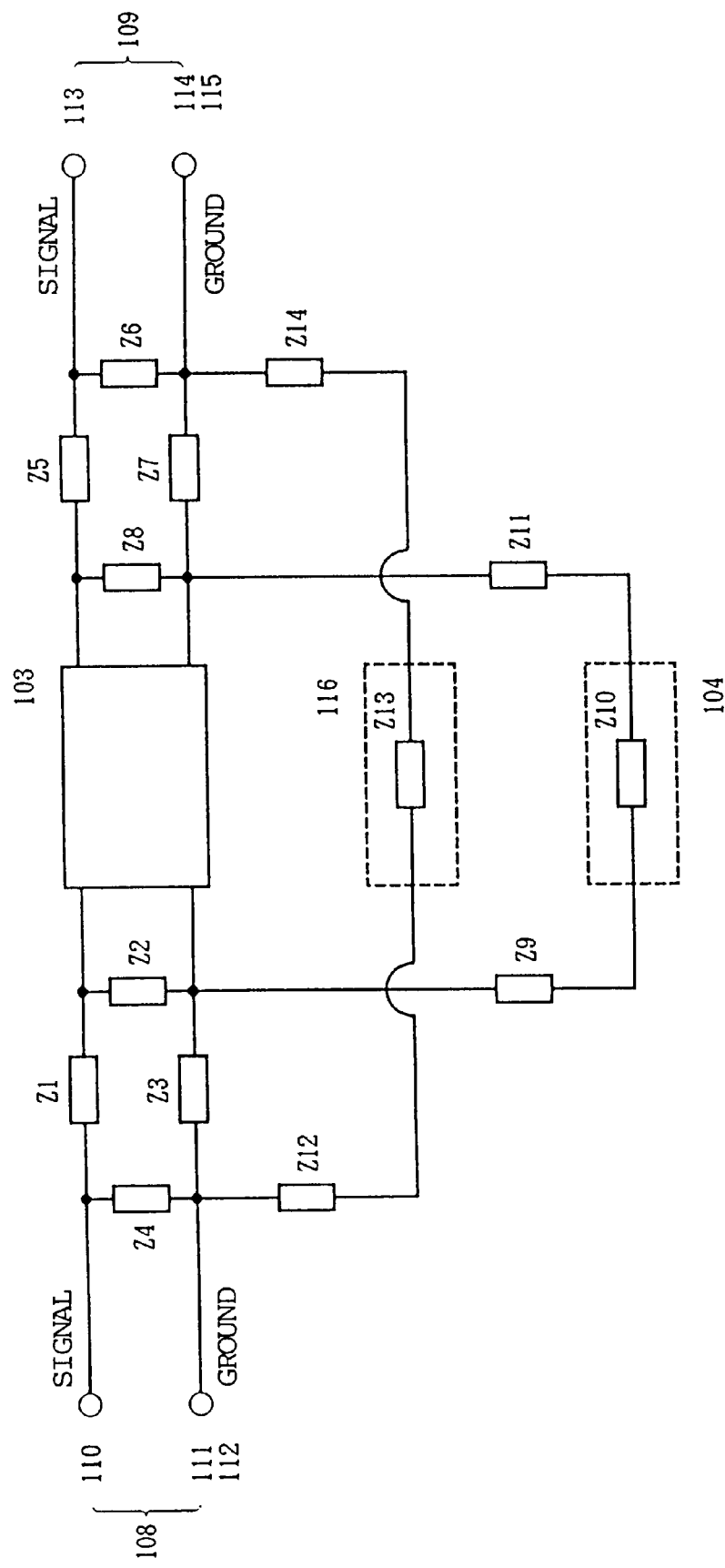
FIG. 3 is a circuit diagram showing a package of the conventional acoustic surface wave device.

This structure is equivalent to the circuit shown in FIG. 3 in which the positions Z9, Z12 are blocked. That is, electrical connection between the input ground terminals 11, 12 and the output ground terminals 14, 15 through the metallic cap 4 and that through the die-attach portion 16 are broken. Therefore, the attenuation characteristics of the acoustic surface wave element 3 are prevented from being influenced by the package 4 and being lowered.

Since the metallic cap 4 and the die-attach portion 16 are maintained to be electrically connected to one of the output ground terminals 14, 15 in the above structure, the metallic cap 4 and the die-attach portion 16 has a ground electric potential. Thus, since the metallic cap 4 and the die-attach portion 16 have a shield effect even in the structure described above, anti-noise characteristics can be improved.

Figure 17:
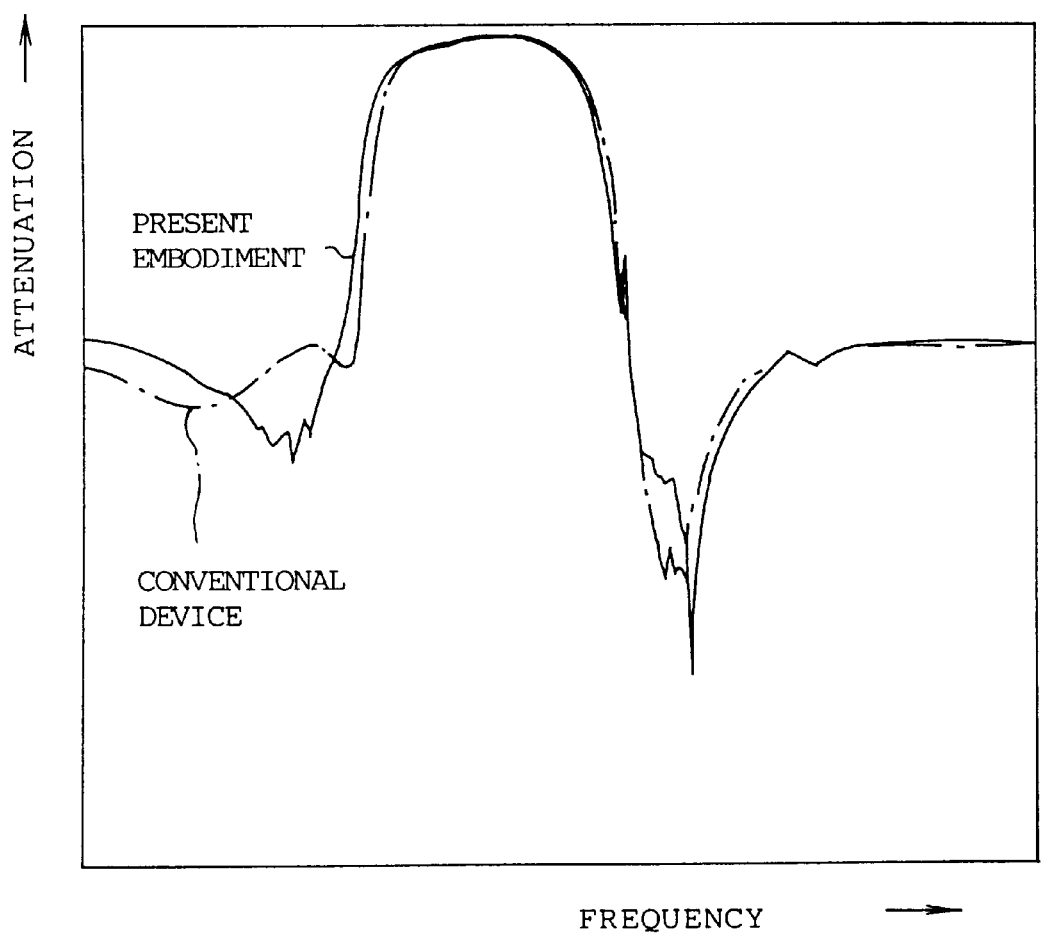
FIG. 17 is a graph showing attenuation characteristics of the acoustic surface wave device of the third embodiment of the present invention.
Figure 18:
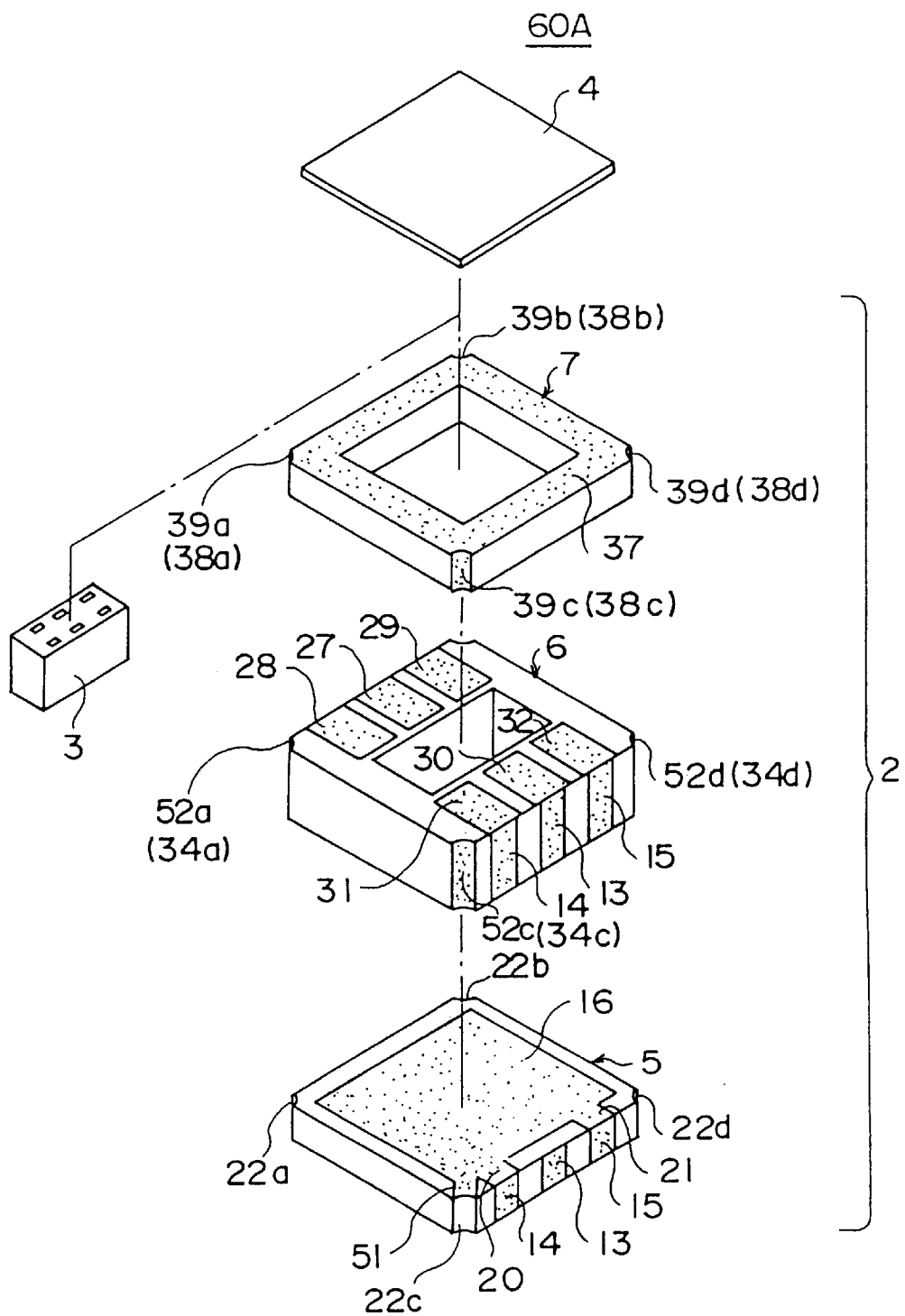
FIG. 18 is an exploded perspective view showing an acoustic surface wave device of a first variation of the third embodiment of the present invention.

FIG. 17 is a graph showing attenuation characteristics of the acoustic surface wave device 60 of the present embodiment. In FIG. 9, the attenuation characteristics of the conventional acoustic surface wave device 100 shown in FIGS. 1 and 2 are also shown for a compression. As can be seen from FIG. 17, the attenuation characteristic of the acoustic surface wave device 60 is improved outside a band, compared with the conventional acoustic surface wave device 100. According to FIG. 9, the acoustic surface wave device 60 of this embodiment improve the attenuation characteristic, compared with the conventional acoustic surface wave device 100.

FIGS. 18–21 show variations of acoustic surface wave devices of the acoustic surface wave device 60 of the third embodiment. An acoustic surface wave device 60A of a first variation shown in FIGS. 18 and 19 basically has the same structure as the acoustic surface wave device 50 of the second embodiment shown in FIG. 13 except that the input ground connecting portions 18, 19 provided in the acoustic surface wave device 50 of the second embodiment shown in FIG. 13 are not provided.

Figure 20:
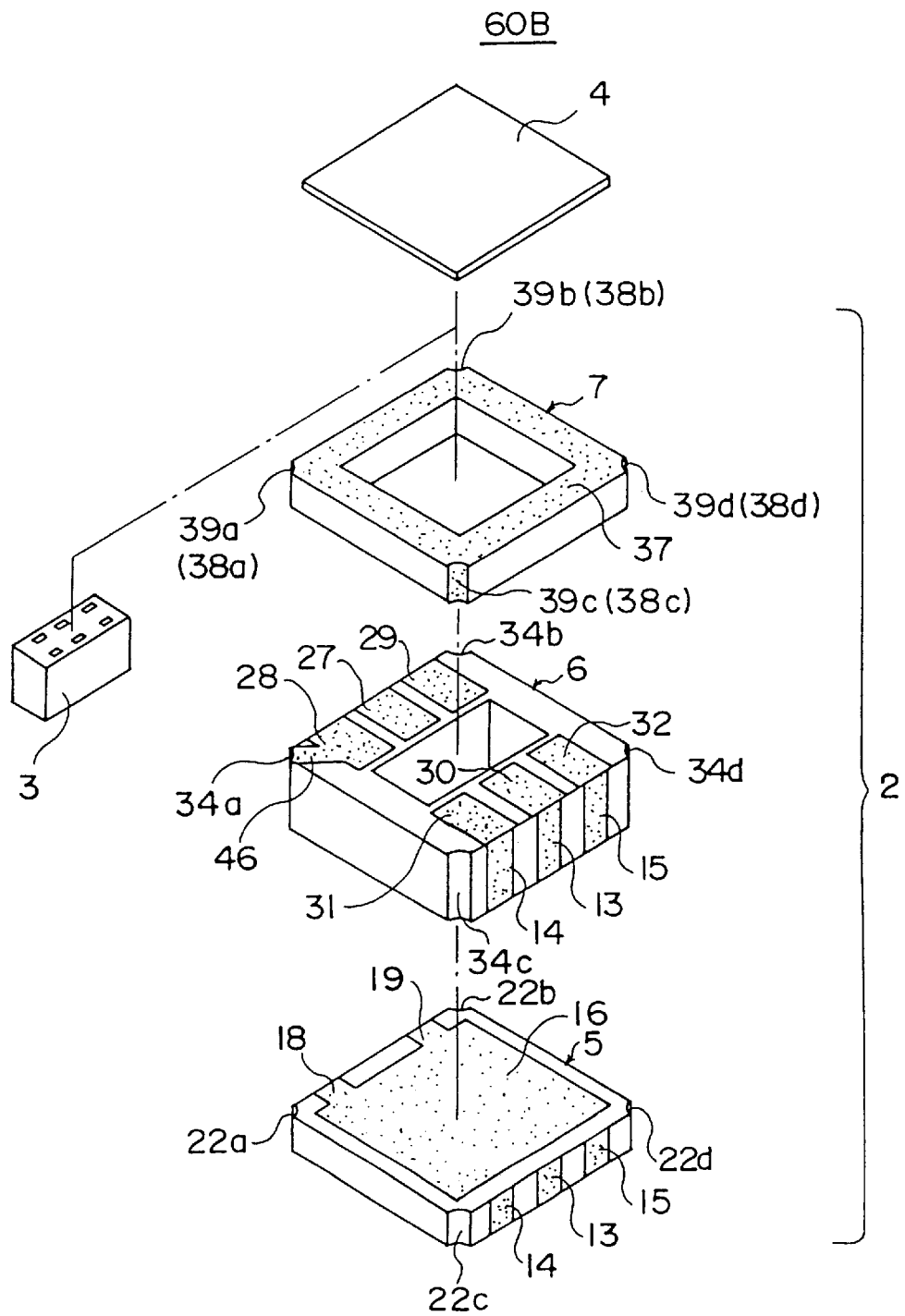
FIG. 20 is an exploded perspective view showing an acoustic surface wave device of a second variation of the third embodiment of the present invention.

An acoustic surface wave device 60B of a second variation shown in FIG. 20 basically has the same structure as the acoustic surface wave device 1B of the second variation of the first embodiment shown in FIG. 11 except that the output ground connecting portions 20, 21 provided in the acoustic surface wave device 1B are not provided in the acoustic surface wave device 60B. As apparent from the above description, the die-attach portion 16 may be connected to either the input ground terminals 11, 12 or the output ground terminals 14, 15 in order to obtain the above advantages. Thus, by the acoustic surface wave device 60B in which the output ground connecting portions 20, 21 are removed and the die-attach portion 16 is electrically connected to the input ground terminals 11, 12, attenuation characteristics of the device may be improved with maintaining the shielding effect.

Figure 21:
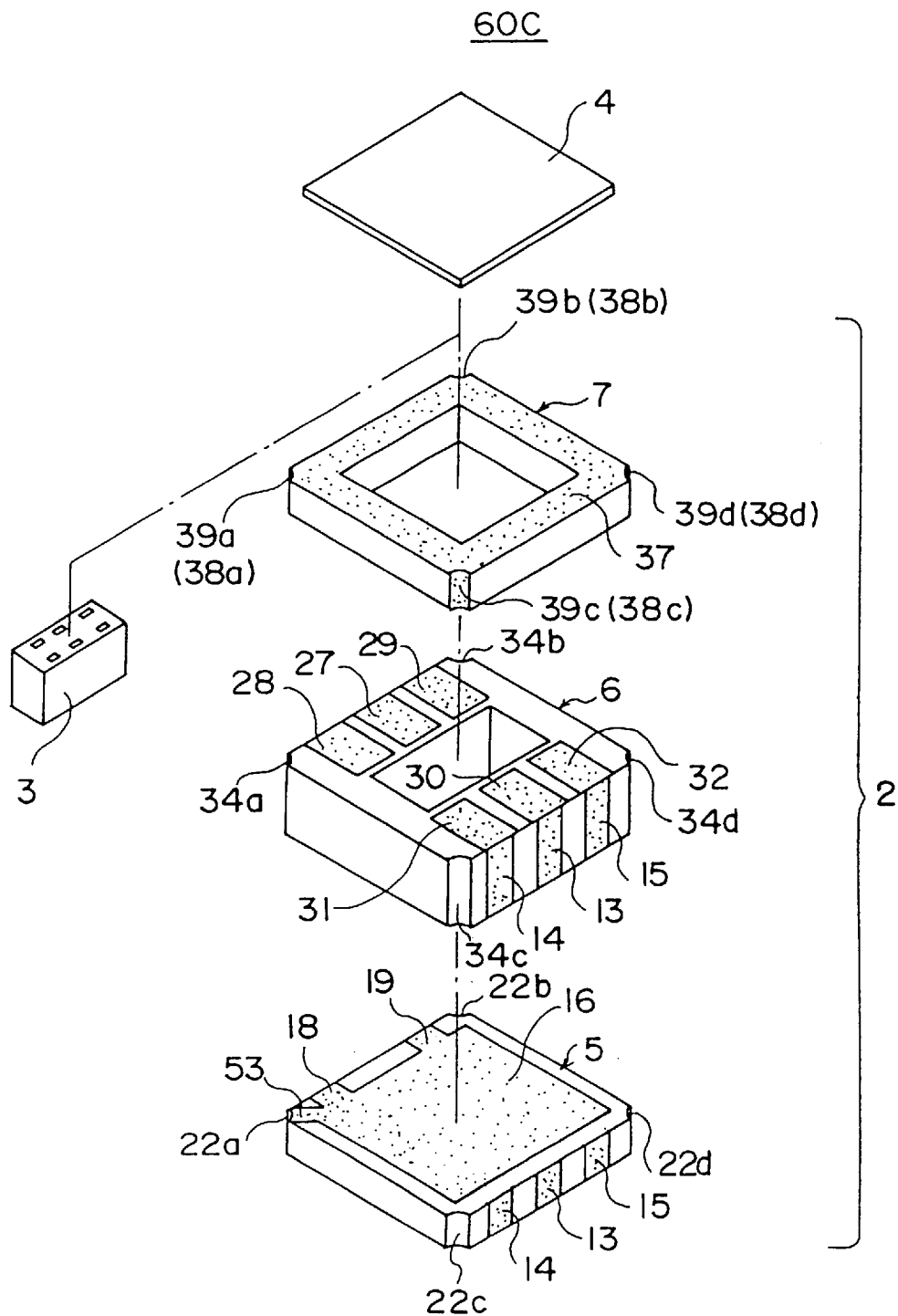
FIG. 21 is an exploded perspective view showing an acoustic surface wave device of a third variation of the third embodiment of the present invention.

An acoustic surface wave device 60C of a second variation shown in FIG. 21 basically has the same structure as the acoustic surface wave device 50A of the variation of the second embodiment shown in FIG. 15 except that the output ground connecting portions 20, 21 provided in the acoustic surface wave device 50A are not provided in the acoustic surface wave device 60C. In the acoustic surface wave devices 60A, 60B, 60C, the electrical connection between the input ground terminals 11, 12 and the output ground terminals 14, 15 through the metallic cap 4 and the electrical connection between the input ground terminals 11, 12 and the output ground terminals 14, 15 through the die-attach portion 16 are blocked. Thus, attenuation characteristics of the devices is prevented from being influenced and deteriorated by the package 4.

In the acoustic surface wave devices 1, 1A, 1B, 50, 50A, 60, 60A, 60B, 60C, the electrical connection between the input terminal 8 and the output terminal 9 through the metallic cap 4 and the electrical connection between the input terminal 8 and the output terminal 9 through the die-attach portion 16 are completely broken. That is, either the input side or the output side of the metallic cap 4 and the die-attach portion 16 is not connected to each terminal 8, 9.

However, when the metallic cap 4 and the die-attach portion 16 are electrically connected to both the input terminal 8 and the output terminal 9, the same advantages as those of the above embodiments may be provided. That is, the metallic cap 4 is connected to one of the input ground terminals 11, 12 of the input terminal 8 and the output ground terminals 14, 15 of the output terminal 9 with a high-impedance, and is connected to the other of the input ground terminals 11, 12 of the input terminal 8 and the output ground terminals 14, 15 of the output terminal 9 with a low-impedance.

Also, the die-attach portion may be connected to one of the input ground terminals 11, 12 of the input terminal 8 and the output ground terminals 14, 15 of the output terminal 9 with a high-impedance, and be connected to the other of the input ground terminals 11, 12 of the input terminal 8 and the output ground terminals 14, 15 of the output terminal 9 with a low-impedance.

In the above devices, the electrical connection between the terminals and the die-attach portion or the electrical connection between the terminals and the metallic cap may be lowered. Therefore, the attenuation characteristics of the devices can be improved.

The present invention includes an acoustic surface wave device which includes a plurality of acoustic surface wave chips or elements housed in a ceramic package such as the ceramic package 2. For example, two acoustic surface wave elements 3 are arranged side by side or in line and are housed in the ceramic package 2. In this case, the ceramic package 2 may have more patterns and terminals because the package 2 houses two elements. The ground terminals of the input terminals of the two elements are electrically connected to either the cap or die-attach portion, and the ground terminals of the output terminals thereof are electrically connected to either the cap or the die-attach portion or both. The device thus constructed have the same advantages as the aforementioned devices having a single acoustic surface wave element.

More particularly, an acoustic surface wave device includes acoustic surface wave elements; a ceramic package having a ceramic substrate of a multi-layer structure, the ceramic substrate having a die-attach portion on which the acoustic surface wave elements are mounted, the ceramic package having an input terminal and an output terminal connected to the acoustic surface wave elements, the ceramic package having an opening located above the ceramic substrate, each of the input terminal and the output terminal having a ground terminal. Further, the device includes a metallic cap sealing the opening of the ceramic package. The metallic cap is electrically connected to one of the ground terminal of the input terminal of each of the acoustic surface wave elements and the ground terminal of the output terminal of each thereof.

The present invention also includes an acoustic surface wave device including acoustic surface wave elements, and a ceramic package having a ceramic substrate of a multi-layer structure, the ceramic substrate having a die-attach portion on which the acoustic surface wave elements are mounted, the ceramic package having an input terminal and an output terminal connected to the acoustic surface wave elements, the ceramic package having an opening located above the ceramic substrate, each of the input terminal and the output terminal having a ground terminal. Further, the device includes a metallic cap sealing the opening of the ceramic package. The die-attach portion is electrically connected to one of the ground terminal of the input terminal of each of the acoustic surface wave elements and the ground terminal of the output terminal of each thereof.

The present invention also includes an acoustic surface wave device comprising acoustic surface wave elements, and a ceramic package having a ceramic substrate of a multi-layer structure, the ceramic substrate having a die-attach portion on which the acoustic surface wave elements are mounted, the ceramic package having an input terminal and an output terminal connected to the acoustic surface wave elements, the ceramic package having an opening located above the ceramic substrate, each of the input terminal and the output terminal having a ground terminal. The device further includes a metallic cap sealing the opening of the ceramic package. The metallic cap is electrically connected to one of the ground terminal of the input terminal of each of the acoustic surface wave elements and the ground terminal of the output terminal of each thereof, and the die-attach portion is electrically connected to one of the ground terminal of the input terminal of each of the acoustic surface wave elements and the ground terminal of the output terminal of each thereof.

The present invention is not limited to the specifically described embodiments, and various variations and modifications can be made without departing from the scope of the present invention.

What is claimed:

1. An acoustic surface wave device comprising:
   an acoustic surface wave element;
   a ceramic package having a ceramic substrate of a multi-layer structure, said ceramic substrate having a die-attach portion on which said acoustic surface wave element is mounted, said ceramic package having an input terminal and an output terminal connected to said acoustic surface wave element, said ceramic package having an opening located above said ceramic substrate, each of said input terminal and said output terminal having a ground terminal; and
   a metallic cap sealing said opening of said ceramic package;
   wherein said metallic cap is electrically connected to only one of said ground terminal of said input terminal and said ground terminal of said output terminal via a single connection.

2. The acoustic surface wave device according to claim 1, wherein said input terminal and said output terminal has a pad connected to said acoustic surface wave element and a foot pattern portion functioning as an outer output terminal, and said metallic cap is electrically connected to one of said ground terminal of said input terminal and said ground terminal of said output terminal.

3. The acoustic surface wave device according to claim 1, wherein said die-attach portion is electrically connected to one of said ground terminal of said input terminal and said ground terminal of said output terminal, and said metallic cap is electrically connected to one of said input terminal and said output terminal to which said ground terminal is connected in said die-attach portion.

4. The acoustic surface wave device as claimed in claim 1, wherein said ceramic substrate comprises notches provided at corners thereof and conductors provided in the notches, said conductor electrically connecting said metallic cap to one of said ground terminal of said input terminal and said ground terminal of said output terminal.

5. An acoustic surface wave device comprising:
   an acoustic surface wave element;
   a ceramic package having a ceramic substrate of a multi-layer structure, said ceramic substrate having a die-attach portion on which said acoustic surface wave element is mounted, said ceramic package having an input terminal and an output terminal connected to said acoustic surface wave element, said ceramic package having an opening located above said ceramic substrate, each of said input terminal and said output terminal having a ground terminal; and
   a metallic cap sealing said opening of said ceramic package;
   wherein said metallic cap is electrically connected to only one of said ground terminal of said input terminal and said ground terminal of said output terminal via a single connection, and said die-attach portion is electrically connected to one of said ground terminal of said input terminal and said ground terminal of said output terminal via a single connection.

6. The acoustic surface wave device according to claim 5, wherein said input terminal and said output terminal has a pad connected to said acoustic surface wave element and a foot pattern portion functioning as an outer output terminal, and said metallic cap is electrically connected to one of said ground terminal of said input terminal and said ground terminal of said output terminal.

7. The acoustic surface wave device according to claim 5, wherein said die-attach portion is electrically connected to one of said ground terminal of said input terminal and said ground terminal of said output terminal, and said metallic cap is electrically connected to one of said input terminal and said output terminal to which said ground terminal is connected in said die-attach portion.

8. The acoustic surface wave device as claimed in claim 5, wherein said ceramic substrate comprises notches provided at corners thereof and conductors provided in the notches, said conductor electrically connecting said metallic cap to one of said ground terminal of said input terminal and said ground terminal of said output terminal, and electrically connecting said die-attach portion to one of said ground terminal of said input terminal and said ground terminal of said output terminal.

9. An acoustic surface wave device comprising:

an acoustic surface wave element;

a ceramic package having a ceramic substrate of a multilayer structure, said ceramic substrate having a die-attach portion on which said acoustic surface wave element is mounted, said ceramic package having an input terminal and an output terminal connected to said acoustic surface wave element, said ceramic package having an opening, each of said input terminal and said output terminal having a ground terminal; and a metallic cap sealing said opening of said ceramic package;

wherein said die attach portion is electrically connected to one of said ground terminal of said input terminal and said ground terminal of said output terminal with a high impedance and said die-attach portion is electrically connected to the other of said ground terminal of said input terminal and said ground terminal of said output terminal with a low impedance.

10. An acoustic surface wave device comprising:

an acoustic surface wave element;

a ceramic package having a ceramic substrate of a multilayer structure, said ceramic substrate having a die-attach portion on which said acoustic surface wave element is mounted, said ceramic package having an input terminal and an output terminal connected to said acoustic surface wave element, said ceramic package having an opening, each of said input terminal and said output terminal having a ground terminal; and a metallic cap sealing said opening of said ceramic package;

wherein said metallic cap is electrically connected to one of said ground terminal of said input terminal and said ground terminal of said output terminal with a high impedance, said metallic cap is electrically connected to the other of said ground terminal of said input terminal and said ground terminal of said output terminal with a low impedance, said die attach portion is electrically connected to one of said ground terminal of said input terminal and said ground terminal of said output terminal with a high impedance and said die-attach portion is electrically connected to the other of said ground terminal of said input terminal and said ground terminal of said output terminal with a low impedance.

11. An acoustic surface wave device comprising:

acoustic surface wave elements;

a ceramic package having a ceramic substrate of a multilayer structure, said ceramic substrate having a die-attach portion on which said acoustic surface wave elements are mounted, said ceramic package having an input terminal and an output terminal connected to said acoustic surface wave elements, said ceramic package having an opening located above said ceramic substrate, each of said input terminal and said output terminal having a ground terminal; and a metallic cap sealing said opening of said ceramic package;

wherein said metallic cap is electrically connected to only one of said ground terminal of said input terminal of each of the acoustic surface wave elements and said ground terminal of said output terminal of each thereof via a single connection.

12. An acoustic surface wave device comprising:

acoustic surface wave elements;

a ceramic package having a ceramic substrate of a multilayer structure, said ceramic substrate having a die-attach portion on which said acoustic surface wave elements are mounted, said ceramic package having an input terminal and an output terminal connected to said acoustic surface wave elements, said ceramic package having an opening located above said ceramic substrate, each of said input terminal and said output terminal having a ground terminal; and a metallic cap sealing said opening of said ceramic package;

wherein said die-attach portion is electrically connected to only one of said ground terminal of said input terminal of each of the acoustic surface wave elements and said ground terminal of said output terminal of each thereof via a single connection.

13. An acoustic surface wave device comprising:

acoustic surface wave elements;

a ceramic package having a ceramic substrate of a multilayer structure, said ceramic substrate having a die-attach portion on which said acoustic surface wave elements are mounted, said ceramic package having an input terminal and an output terminal connected to said acoustic surface wave elements, said ceramic package having an opening located above said ceramic substrate, each of said input terminal and said output terminal having a ground terminal; and a metallic cap sealing said opening of said ceramic package;

wherein said metallic cap is electrically connected to only one of said ground terminal of said input terminal of each of the acoustic surface wave elements and said ground terminal of said output terminal of each thereof via a single connection, and said die-attach portion is electrically connected to one of said ground terminal of said input terminal of each of the acoustic surface wave elements and said ground terminal of said output terminal of each thereof via a single connection.

14. An acoustic surface wave device comprising:

an acoustic surface wave element;

a ceramic package having a ceramic substrate of a multilayer structure, said ceramic substrate having a die-attach portion on which said acoustic surface wave element is mounted, said ceramic package having an input terminal and an output terminal connected to said acoustic surface wave element, said ceramic package having an opening, each of said input terminal and said output terminal having a ground terminal; and a metallic cap sealing said opening of said ceramic package;

wherein said metallic cap is electrically connected to one of said ground terminal of said input terminal and said ground terminal of said output terminal with a high impedance and said metallic cap is electrically connected to the other of said ground terminal of said input terminal and said ground terminal of said output terminal with a low impedance.

* * * * *